(12) United States Patent
Lindblad

(10) Patent No.: US 9,891,725 B2
(45) Date of Patent: *Feb. 13, 2018

(54) ELECTRONIC DEVICE

(71) Applicant: SEMICONDUCTOR ENERGY LABORATORY CO., LTD., Atsugi-shi, Kanagawa-ken (JP)

(72) Inventor: Julian Lindblad, Kanagawa (JP)

(73) Assignee: SEMICONDUCTOR ENERGY LABORATORY CO., LTD., Kanagawa-ken (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/144,967

(22) Filed: May 3, 2016

(65) Prior Publication Data

US 2016/0313811 A1 Oct. 27, 2016

Related U.S. Application Data

(63) Continuation of application No. 14/702,870, filed on May 4, 2015, now Pat. No. 9,337,434.

(30) Foreign Application Priority Data

May 6, 2014 (JP) .................................. 2014-095610

(51) Int. Cl.
*G06F 3/0362* (2013.01)
*G06F 1/16* (2006.01)
(Continued)

(52) U.S. Cl.
CPC .......... *G06F 3/0362* (2013.01); *G06F 1/1652* (2013.01); *G06F 3/0412* (2013.01);
(Continued)

(58) Field of Classification Search
None
See application file for complete search history.

(56) References Cited

U.S. PATENT DOCUMENTS

| | | | |
|---|---|---|---|
| 8,415,208 B2 | 4/2013 | Takayama et al. | |
| 8,427,420 B2 | 4/2013 | Yamazaki et al. | |

(Continued)

FOREIGN PATENT DOCUMENTS

| | | | |
|---|---|---|---|
| CN | 101133434 A | 2/2008 | |
| CN | 104220963 A | 12/2014 | |

(Continued)

OTHER PUBLICATIONS

International Search Report (Application No. PCT/IB2015/052959) dated Aug. 4, 2015.

(Continued)

*Primary Examiner* — Ashok Patel
(74) *Attorney, Agent, or Firm* — Nixon Peabody LLP; Jeffrey L. Costellia

(57) ABSTRACT

A novel electronic device including a flexible display is presented. The electronic device has a flexible display including an organic light emission diodes and a plurality of columnar bodies linked together. Users can transform the shape of the electronic device into a tablet, an eBook, or a hand-held gaming device. The electronic device is configured to resize its main display area in accordance with the selected mode.

14 Claims, 18 Drawing Sheets

(51) Int. Cl.
*H01L 51/00* (2006.01)
*H01L 27/32* (2006.01)
*H01L 51/52* (2006.01)
*G09F 9/30* (2006.01)
*G06F 3/041* (2006.01)
*G09G 5/14* (2006.01)

(52) U.S. Cl.
CPC ............ *G06F 3/0416* (2013.01); *G09F 9/301* (2013.01); *G09G 5/14* (2013.01); *H01L 27/323* (2013.01); *H01L 51/0097* (2013.01); *H01L 51/52* (2013.01); *G09G 2340/14* (2013.01); *G09G 2354/00* (2013.01); *G09G 2380/02* (2013.01); *H01L 2251/5338* (2013.01); *Y02E 10/549* (2013.01)

(56) References Cited

U.S. PATENT DOCUMENTS

| | | |
|---|---|---|
| 8,516,728 B2 | 8/2013 | Jung |
| 8,610,118 B2 | 12/2013 | Yamazaki et al. |
| 8,610,155 B2 | 12/2013 | Hatano et al. |
| 8,929,085 B2 | 1/2015 | Franklin et al. |
| 2003/0201974 A1 | 10/2003 | Yin |
| 2008/0055831 A1 | 3/2008 | Satoh |
| 2010/0033435 A1* | 2/2010 | Huitema ............... G06F 1/1615 345/173 |
| 2010/0317409 A1 | 12/2010 | Jiang et al. |
| 2011/0050657 A1 | 3/2011 | Yamada |
| 2011/0227822 A1* | 9/2011 | Shai ...................... G06F 1/1615 345/156 |
| 2012/0217516 A1 | 8/2012 | Hatano et al. |
| 2013/0002133 A1 | 1/2013 | Jin et al. |
| 2013/0180882 A1 | 7/2013 | Hamers et al. |
| 2013/0194761 A1 | 8/2013 | Kim |
| 2013/0265221 A1 | 10/2013 | Lee et al. |
| 2013/0265257 A1 | 10/2013 | Jung et al. |
| 2013/0300697 A1 | 11/2013 | Kim et al. |
| 2014/0028597 A1 | 1/2014 | Cho et al. |
| 2014/0098095 A1* | 4/2014 | Lee ........................ G06F 3/041 345/420 |
| 2014/0099999 A1 | 4/2014 | Hatano et al. |
| 2014/0240264 A1 | 8/2014 | Im et al. |
| 2014/0306260 A1 | 10/2014 | Yamazaki et al. |
| 2014/0337621 A1* | 11/2014 | Nakhimov ............. G06F 1/163 713/168 |

FOREIGN PATENT DOCUMENTS

| | | |
|---|---|---|
| EP | 1830336 A | 9/2007 |
| EP | 2648078 A | 10/2013 |
| JP | 11-272205 A | 10/1999 |
| JP | 2002-278515 A | 9/2002 |
| JP | 2009-170173 A | 7/2009 |
| JP | 4777338 | 9/2011 |
| JP | 2015-518579 | 7/2015 |
| KR | 2013-0113901 A | 10/2013 |
| TW | I275863 | 3/2007 |
| WO | WO-2006/090434 | 8/2006 |
| WO | WO-2013/154293 | 10/2013 |

OTHER PUBLICATIONS

Written Opinion (Application No. PCT/IB2015/052959) dated Aug. 4, 2015.

* cited by examiner

Extended Length = $r\theta$ $\theta = 2\arctan((a-b)/2h)$ (in radian)

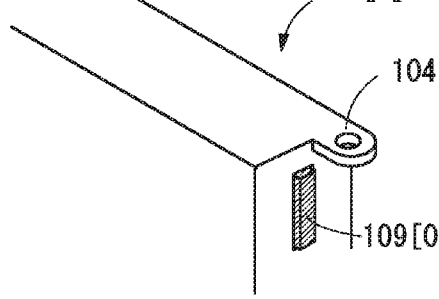
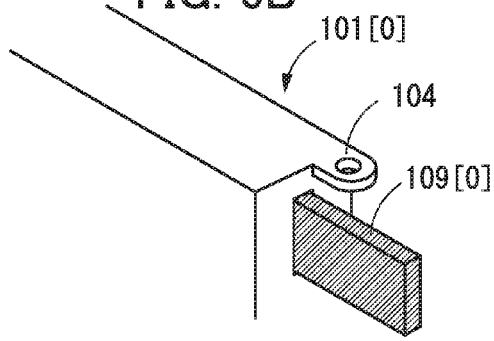
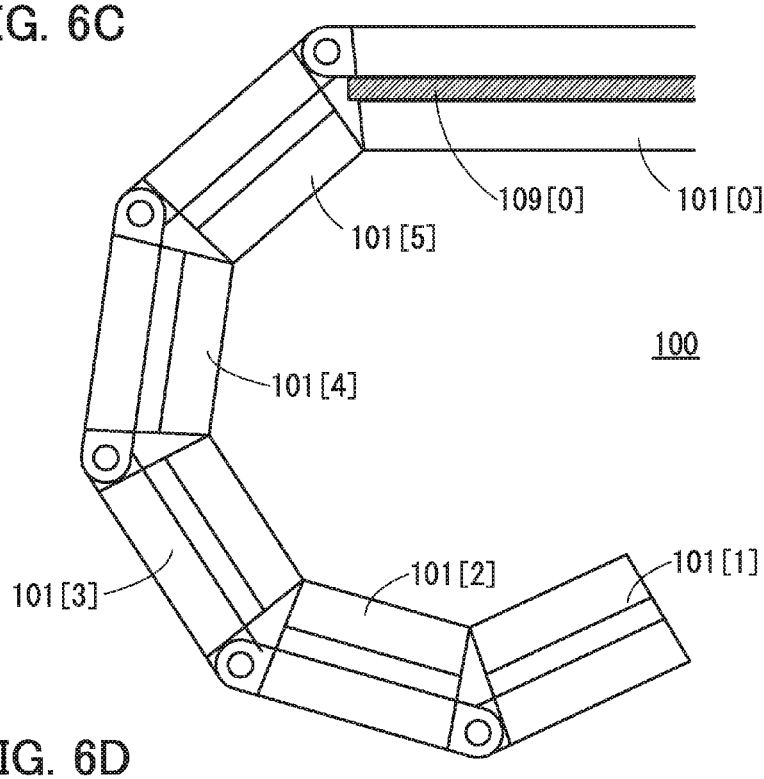
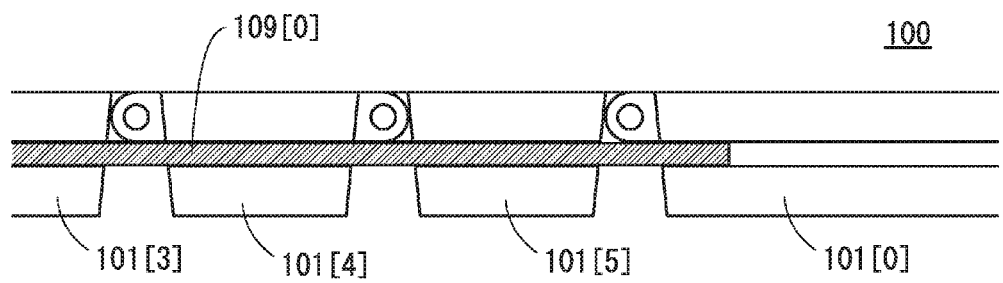

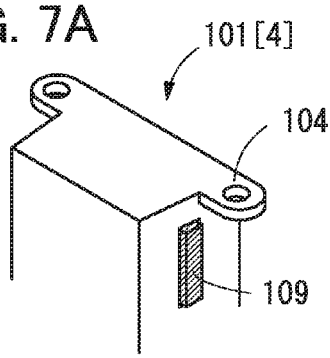
FIG. 7A
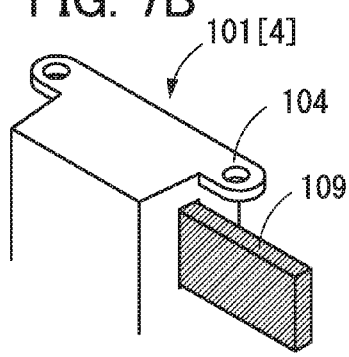
FIG. 7B
FIG. 7C
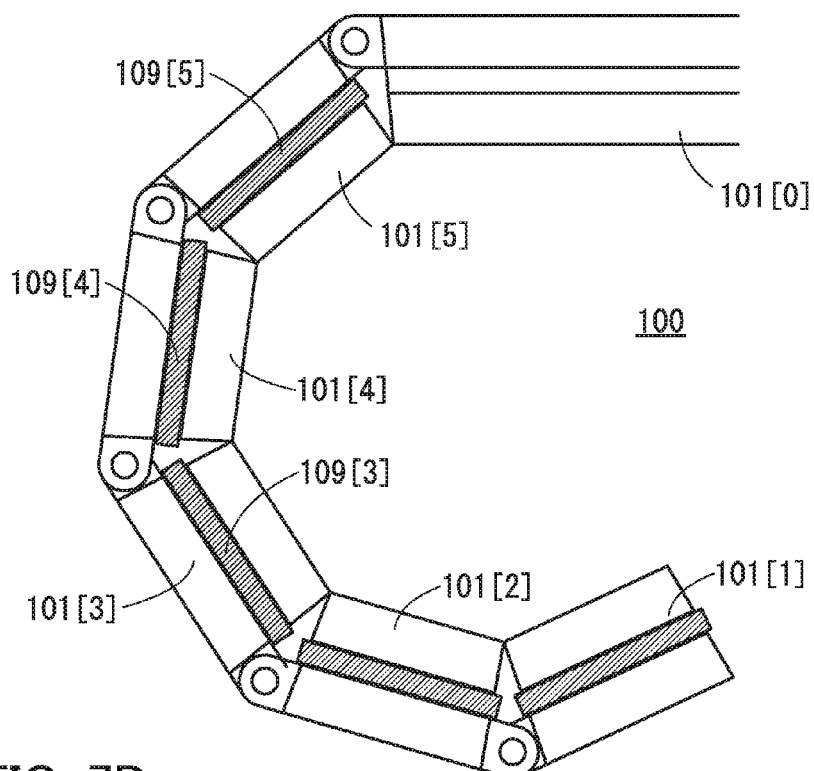
FIG. 7D
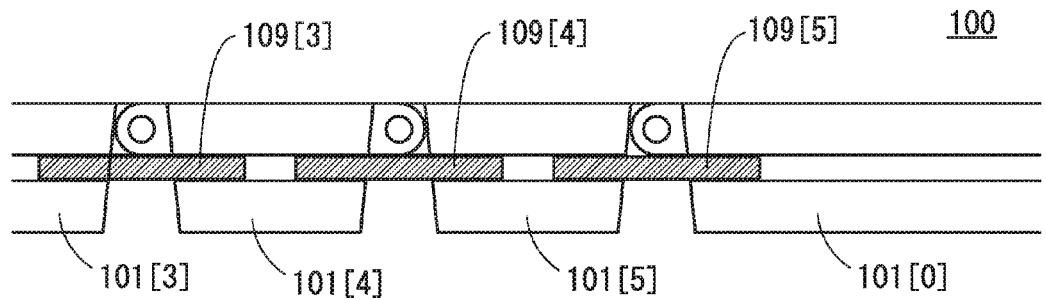

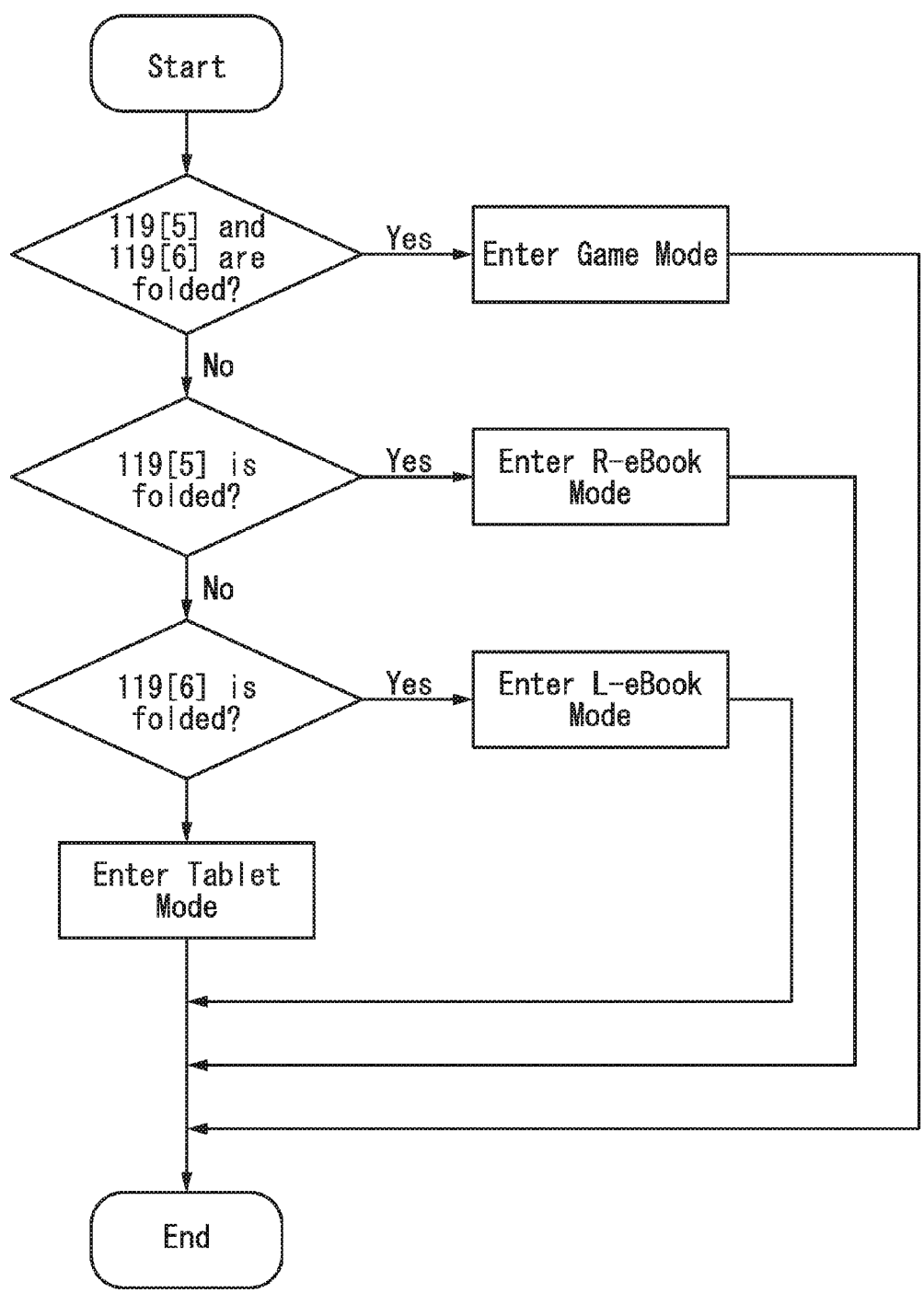

(Unusable Left Width) = L * (Unit Width)

(Unusable Right Width) = R * (Unit Width)

ELECTRONIC DEVICE

TECHNICAL FIELD

This disclosure is related to electronic devices.

BACKGROUND ART

A variety of types of electronic devices having flexible displays have been proposed (see Patent Documents 1 and 2, for example).

REFERENCE

Patent Document

[Patent Document 1] U.S. Pat. No. 8,427,420
[Patent Document 2] United States Patent Application Publication No. 2014/0028597

DISCLOSURE OF INVENTION

Any novel one of circuits, architectures, driving methods, and electronic devices related to or having display devices is provided in this disclosure.

Specifically, an electronic device that includes a flexible display including a device layer and a plurality of columnar bodies is provided, but one embodiment of the invention is not limited thereto. The electronic device may have the following features. That is, each of the plurality of columnar bodies is mechanically or physically linked with neighboring one or two of the columnar bodies at a link portion and rotatable around an axis at the link portion. The flexible display is designed to change its shape in accordance with a shape formed by the plurality of columnar bodies. The flexible display is configured to show a first display area. A grip can be formed by rolling at least one of a right side and a left side of the electronic device, by rotating some of the plurality of columnar bodies around the axes at the link portions. A portion of the flexible display corresponding to the grip is designed to be located between a hand of a user and the plurality of columnar bodies that constitute the grip when the user holds the grip. The first display area is configured to be resized when the grip is formed. Furthermore, the flexible display may be configured to show a second display area in the grip. Furthermore, an angle formed by neighboring columnar bodies may be limited by a stop provided for each of the columnar bodies. Furthermore, the electronic device may be configured to show a first image at a first portion of the first display area and a second image for controlling the first image at a second portion of the first display area when both the right side and the left side of the electronic device are rolled. Furthermore, the electronic device may be designed to be prevented from being folded by a plate provided through two or more of the columnar bodies. Furthermore, the device layer may include organic light emission diodes (OLEDs) and circuits for controlling the OLEDs. Furthermore, the flexible display may include an elastic material.

Users can easily transform the shape of the electronic device as a tablet, an eBook or a hand-held gaming device. The electronic device is configured to change the size of its main display area and to arrange or provide buttons for operation, in accordance with the shape. For example, holding the electronic device comfortably with one hand and reading a newspaper on the electronic device while holding a cup with the other hand (eBook mode), or holding the electronic device with both hands like a hand-held gaming device (game mode), which allows more comfortable and stable grip of the electronic device while playing a game, in addition to using the electronic device as a normal tablet device (tablet mode), is possible with one device.

BRIEF DESCRIPTION OF DRAWINGS

In the accompanying drawings:
FIGS. 6A to 6D show examples for explaining an electronic device;
FIGS. 7A to 7D show examples for explaining an electronic device;
FIG. 16 shows an example for explaining a driving method of an electronic device.

BEST MODE FOR CARRYING OUT THE INVENTION

Embodiments will hereinafter be described with reference to drawings. However, the embodiments can be implemented with many different modes. It will be readily appreciated by those skilled in the art that modes and details can be changed in various ways without departing from the spirit and scope of the disclosure.

For enhancing the comfort for a user when holding a tablet-like electronic device, this embodiment introduces grips (or gripped portions) to the electronic device by rolling its right and/or left sides. The use of a foldable electronic device enables such grips to be formed. Using this method, the user can roll one or both of the right and the left sides to form cylinder-shaped grips that make the electronic device easy to hold with one or two hands in addition to the normal tablet usage (tablet mode).

One of possible use cases is holding the electronic device comfortably with one hand and reading news or novels on the electronic device while holding a cup with the other hand (eBook mode). In this mode, the electronic device may display electronic buttons (software buttons) for minimum operation (page back, forward, and exit, for example) within the reach of fingers or thumb of the hand that holds the electronic device.

Another use case is transformation of the electronic device into a hand-held gaming device, which allows more comfortable and stable grip of the electronic device while playing a game on the electronic device (game mode).

(Supporting Body)

Figure 1A:
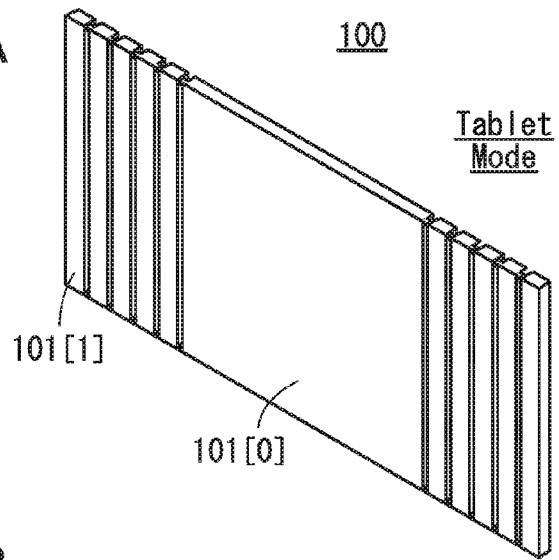
FIGS. 1A to 1C show examples for explaining an electronic device.
Figure 1B:
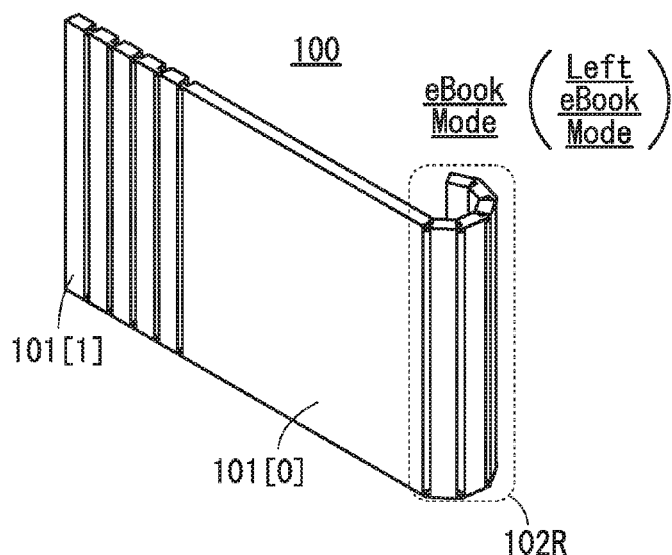
Figure 1C:
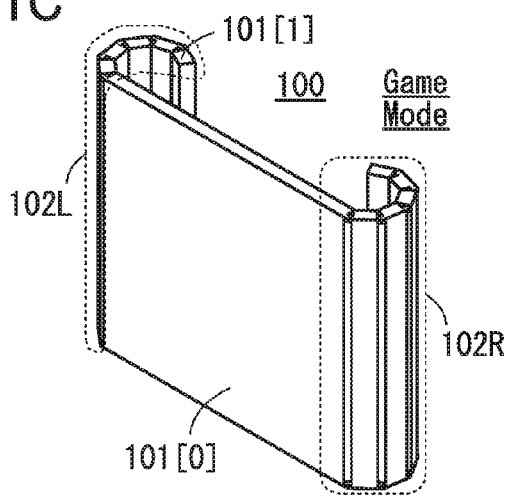

The electronic device may be made by attaching a foldable OLED display on a supporting body. The supporting body may have a plurality of chained trapezoid or rectangular columnar bodies. FIGS. 1A to 1C show transformations of a supporting body 100 corresponding to the above three modes. FIG. 1A, FIG. 1B and FIG. 1C show the tablet mode, the eBook mode (the left eBook mode) and the game mode, respectively.

The positions of columnar bodies 101[0] and 101[1] are indicated in FIG. 1A, FIG. 1B, and FIG. 1C, among columnar bodies 101. For example, a right grip 102R is formed by rolling the right side of the supporting body 100, as shown in FIG. 1B. Further, a left grip 102L is formed by rolling also the left side of the supporting body 100, as shown in FIG. 1C.

Figure 2A:
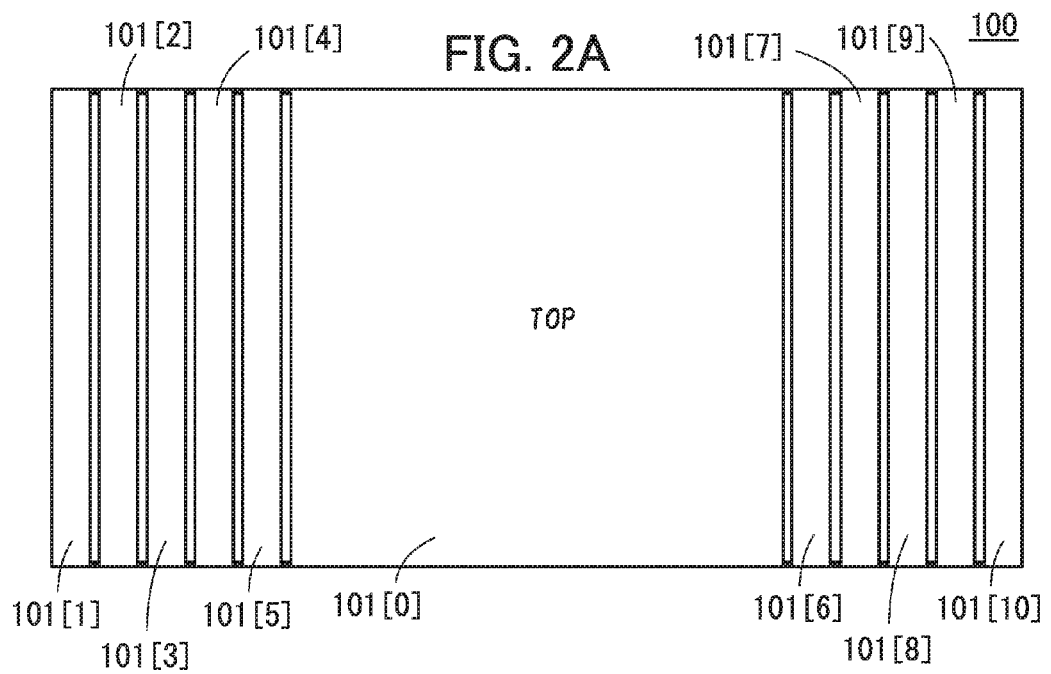
FIGS. 2A to 2C show examples for explaining an electronic device.
Figure 2B:
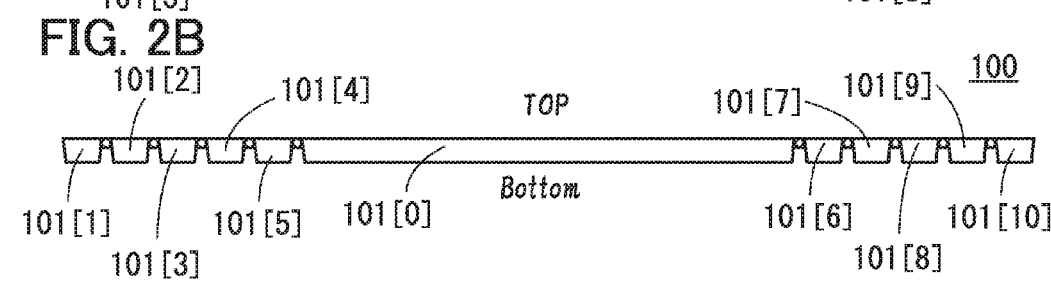
Figure 2C:
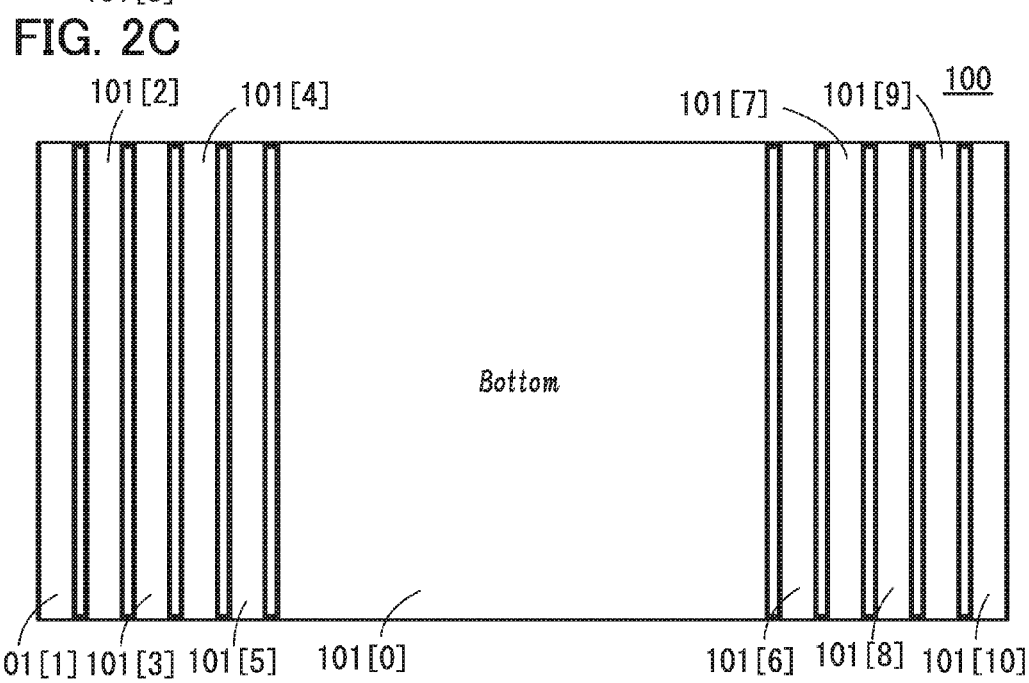

FIG. 2A, FIG. 2B, and FIG. 2C show views from the top, the side and the bottom of the supporting body 100 in the tablet mode, respectively. As seen, the supporting body 100 includes a plurality of columnar bodies (the columnar bodies 101[0] to 101[10]). Each of the columnar bodies has a trapezoid or rectangular cross section and some of them may contain some electronic components, such as processors, memories, batteries, sensors (such as gyroscope sensor or accelerometer), speakers, vibrators, microphones and so on.

(Columnar Body)

Figure 3A:
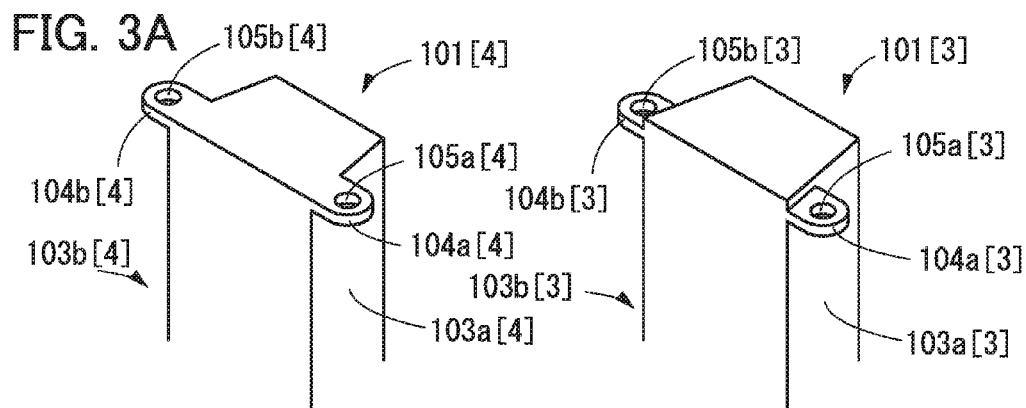
FIGS. 3A to 3C show examples for explaining an electronic device.

Each of the columnar bodies 101 has one or more connection portions for linking to another one or two columnar bodies 101. For example, as shown in FIG. 3A, a columnar body 101[3] has two connection portions, a connection portion 104a[3] and a connection portion 104b[3] on a side surface 103a[3] and a side surface 103b[3], respectively. Note that the side surface 103a[3] opposes to the side surface 103b[3]. Similarly, a columnar body 101[4] has a connection portion 104a[4] and a connection portion 104b[4] on a side surface 103a[4] and a side surface 103b[4], respectively. Although not shown, the columnar body 101[3] has a similar structure with two connection portions at the other end.

The connection portions 104a and 104b have holes 105a and 105b, respectively. An axis may be provided through the holes 105a or 105b for linking two columnar bodies 101. For example, the columnar bodies 101[3] and 101[4] are linked by the connection portions 104b[3] and 104a[4] with holes 105a[4] and 105b[3] overlapping with each other.

The center of each of the holes 105a and 105b may be a rotation axis of the columnar bodies 101 that are linked by the hole. Therefore, for example, the columnar body 101[3] and the columnar body 101[4] are rotatable around the rotation axis that can be formed in the hole 105a[4](the hole 105b[3]). Also, each of the other columnar bodies 101 is rotatable around each of the corresponding rotation axis, and these rotation axes may be substantially parallel to each other.

In the example of FIG. 3A, the connection portions 104a[3] and 104b[3] of the columnar body 101[3] is lower than the connection portions 104a[4] and 104b[4] of the next columnar body 101[4] so that the connection portion 104b [3] of the columnar body 101[3] is mechanically and/or physically linked to the corresponding connection portion 104a[4] of the columnar body 101[4].

Figure 3B:
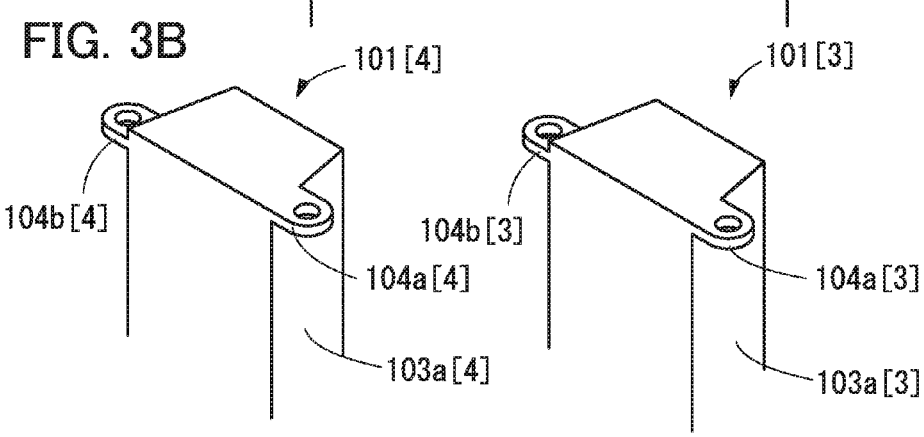

In the example of FIG. 3A, the connection portions 104a and 104b of one columnar body 101 (the connection portions 104a[3] and 104b[3] of the columnar body 101[3], for example) are provided at the same height. In the example of FIG. 3B, the height of two connection portions 104a and 104b of one columnar body 101 is different from each other and the height of the connection portion 104a of the one columnar body 101 is the same as that of the neighboring columnar bodies 101. It is the same for the connection portions 104b.

Figure 3C:
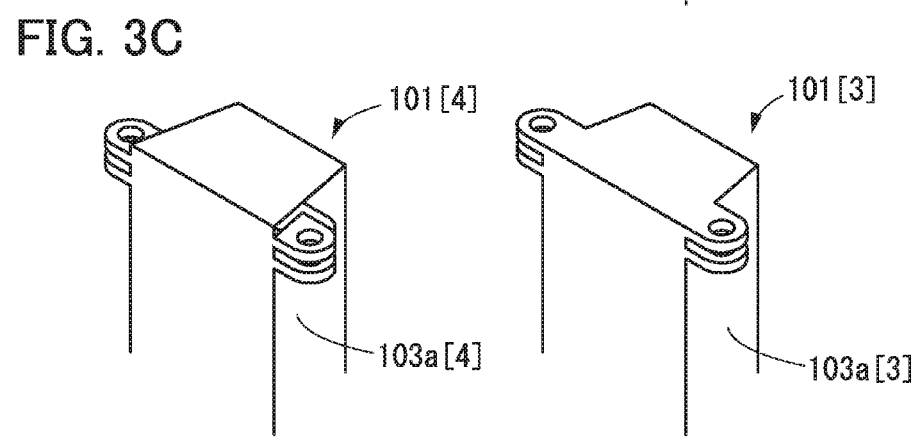

In the example of FIG. 3C, each of the columnar bodies 101 has two or more connection portions at one side surface of one end of the columnar body 101. Although the connection portions 104a and 104b are provided at around the upper ends of the columnar bodies 101 in the examples of FIG. 3A to FIG. 3C, they can be at any place of the columnar bodies 101.

Figure 4A:
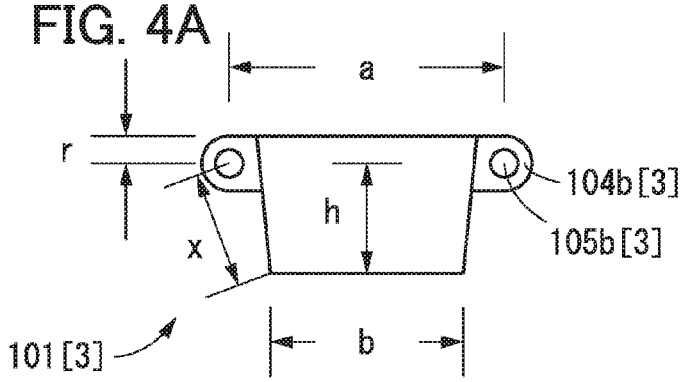
FIGS. 4A to 4C show examples for explaining an electronic device.

FIG. 4A shows a schematic cross-sectional view of the columnar body 101[3] with its major dimensions, i.e., a first length "a", a second length "b", a height "h", a side length "x" and a radius "r". As described above, the columnar body 101[3] has the holes 105a[3] and 105b[3]. The radius "r" is a distance between the center of the hole 105a[3](or the hole 105b[3]) and the top side of (or a plane that includes the top side of) the columnar body 101[3]. The first length "a" is a distance between the centers of the two holes 105a[3] and 105b[3], and the height "h" is a distance between the center of the hole 105a[3](or the hole 105b[3]) and the bottom side of (or a plane that includes the bottom side of) the columnar body 101[3]. The side length "x" is equal to the square root of the sum of the square of "h" and the square of "(a−b)/2".

Figure 4B:
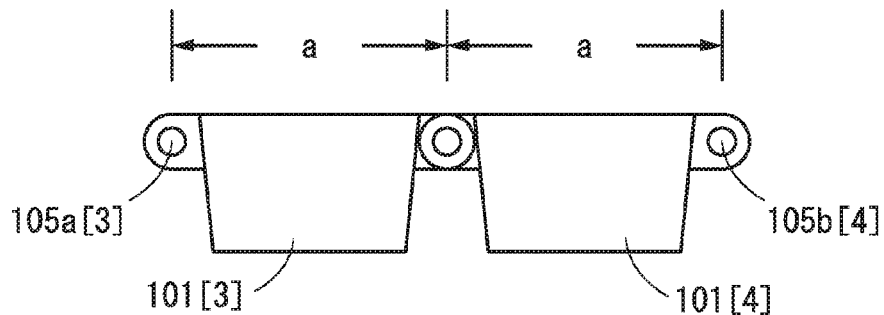

FIG. 4B shows the columnar body 101[3] and the columnar body 101[4] that are stretched linearly. In this state, the length from the outer edge of the columnar body 101[3] to the outer edge of the columnar body 101[4] corresponds to the length from the center of the left hole 105a[3] to the center of the right hole 105b[4], which is "2a".

Figure 4C:
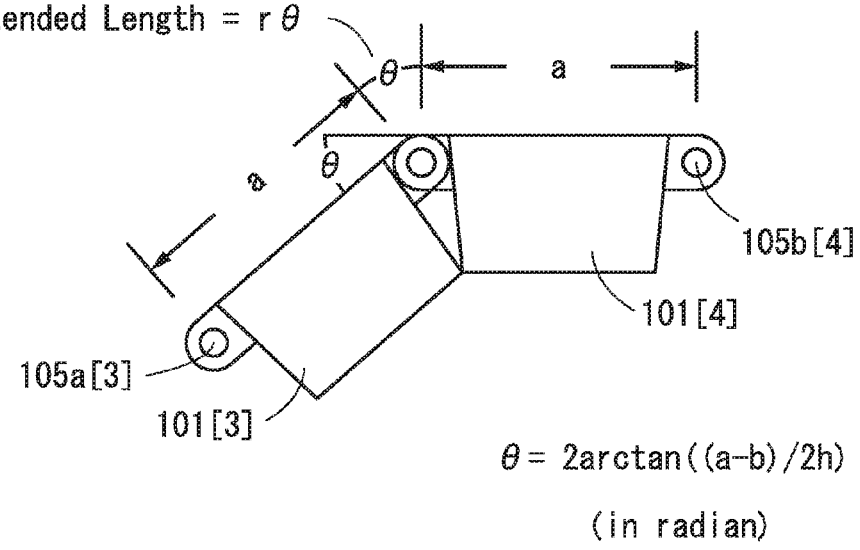

FIG. 4C shows the linked columnar bodies 101[3] and 101[4] that are folded toward the bottom (i.e., folded inside). When folded the most, the columnar body 101[3] and the columnar body 101[4] come into contact with each other at their bottom corners. The maximum rolling angle θ (unit: radian) is given by "2 arctan((a−b)/2h)".

This restricts the rolling of the supporting body 100 as the columnar bodies 101 naturally stop the supporting body 100 from rolling further. Furthermore, using such shaped columnar bodies 101 also sets the minimum radius of the rolled side of the supporting body 100, which makes it easier for the user to hold firmly the formed grip. Smaller columnar bodies 101 can be used in order to make the grips rounder.

By folding, the length from the outer edge of the columnar body 101[3] to the outer edge of the columnar body 101[4] is extended to "2a+rθ" as shown in FIG. 4C. This means that an extra length "rθ" is needed in order to fold the columnar bodies 101[3] and 101[4]. And the smaller "r" brings the shorter extended length. Ideally, if "r" is zero, the extended length is also zero.

In the above-described manner, each of the columnar bodies 101 is mechanically and/or physically linked with one or two neighboring columnar bodies 101 and rotatable around one or two axes. Further, the supporting body 100 is designed such that rolling at least one of the right side and the left side of the supporting body 100 forms the grip 102R or the grip 102L by rotating some of the columnar bodies 101 around the corresponding axes.

(Stop)

Figure 5A:
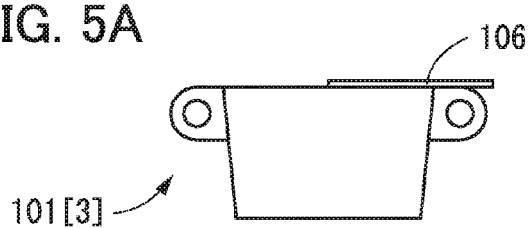
FIGS. 5A to 5D show examples for explaining an electronic device.

Since the electronic device should not be folded toward the top, i.e. the electronic device should be foldable only toward the bottom (or inside); the columnar bodies 101 can be provided with stops 106 that prevent this undesired transformation, as shown in FIG. 5A.

Figure 5B:
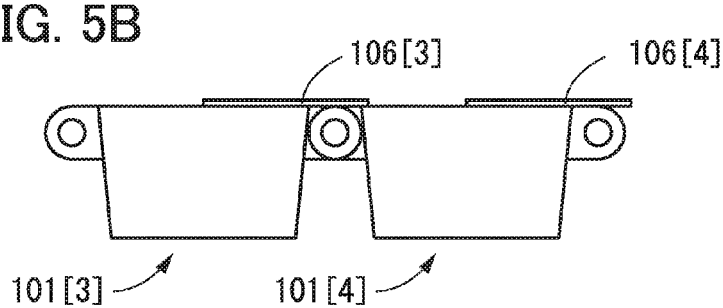

FIG. 5B shows the columnar body 101[3] and the columnar body 101[4] each having the stop 106 that are linked linearly. It is difficult or rather impossible to fold them towards the top without destroying the stops 106.

Figure 5C:
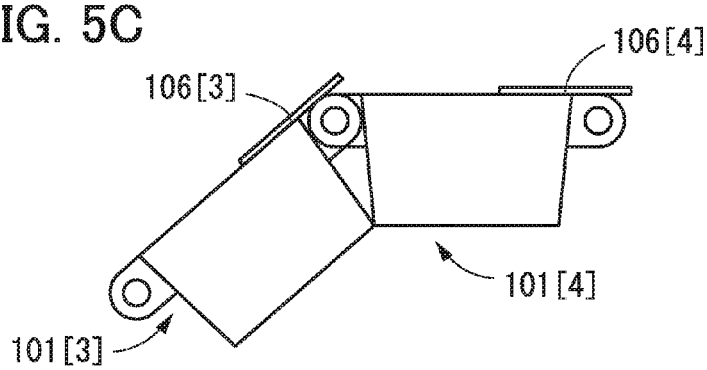

FIG. 5C shows the linked columnar bodies 101[3] and 101[4] that are folded toward inside. It is easy to transform the linked columnar bodies 101[3] and 101[4] from the state shown in FIG. 5B to the state shown in FIG. 5C.

Since the stop 106 protrudes outside of the columnar bodies 101[3] and 101[4] when the columnar bodies 101[3] and 101[4] are folded (see FIG. 5C), the stops 106 may be provided so as not to overlap with the flexible display that is formed over the columnar bodies 101.

Figure 5D:
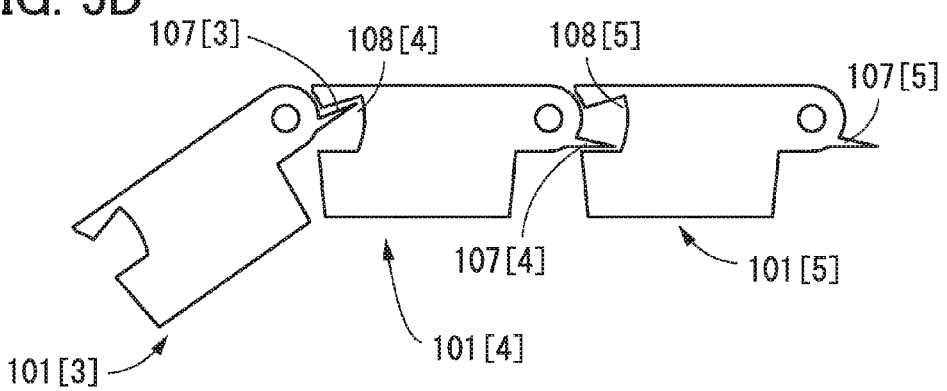

FIG. 5D shows another example. The columnar bodies 101[3], 101[4], and 101[5] have stops 107[3], 107[4] and 107[5], respectively. The stops 107[3] and 107[4] are designed to be stored within hollows 108[4] and 108[5] formed in the columnar bodies 101[4] and 101[5], respectively.

In FIG. 5D, the columnar bodies 101[4] and 101[5] are straight. Even if the user tries to fold the columnar body 101[5] upward (fold outside), the stop 107[4] blocks the bottom wall of the hollow 108[5] that is going up.

It should be noted that the stop 107 can also restrict inside folding. As shown in FIG. 5D, the columnar body 101[3] is folded downward (folded inside). There is a space between the right bottom corner of the columnar body 101[3] and the left bottom corner of the columnar body 101[4]. A further downward folding of the columnar body 101[3], however, is prevented because the stop 107[3] is blocked by the upper wall of the hollow 108[4].

The inner wall of the hollow 108[4] is designed to be outside of the locus that is formed in accordance with the motion (rotation) of the tip of the stop 107[3]. The hollow 108[4] may be substantially closed between the columnar bodies 101[3] and 101[4], and the stop 107[3] substantially moves inside of the hollow 108[4]. Therefore, the unevenness caused by folding the columnar bodies 101 is smaller in FIG. 5D than in FIG. 5C.

(Locking Plate)

During the tablet mode, the electronic device should be rigidly straight. The tablet mode can be enhanced by introducing a locking plate mechanism in the electronic device. A sliding locking plate (or layer, rod, body or the like) made of a rigid material that is built in the electronic device may be used for this purpose. Sliding this into the columnar bodies 101 locks the columnar bodies 101 into a rigid position, and makes the electronic device usable as a regular tablet.

FIGS. 6A to 6D show an example of the locking plate. A locking plate 109[0] is designed such that it is stored in a hollow or hole in the columnar body 101[0](FIG. 6A) and slides outside (FIG. 6B).

FIG. 6C shows a schematic cross-sectional view of the supporting body 100 folded inside. The locking plate 109[0] is stored in the hollow of the columnar body 101[0]. Further, a hollow is formed in each of the other columnar bodies 101[1] to 101[5].

FIG. 6D shows a schematic cross-sectional view of the supporting body 100 in the tablet mode. The locking plate 109[0] slides through the hollows of the columnar bodies 101[5], 101[4], 101[3] and so on to rigidly straighten the supporting body 100.

FIGS. 7A to 7D show another example of the locking plate. A locking plate 109 is designed such that it is stored in a hollow or hole in each of the columnar bodies 101 (FIG. 7A) and slides (FIG. 7B) to another hollow or hole in the neighboring one or more columnar bodies 101.

FIG. 7C shows a schematic cross-sectional view of the supporting body 100 folded inside. Each of the locking plates 109 is stored in the hollow of each columnar body 101. In this example, the columnar body 101[0] is not equipped with any locking plate, although a hollow is provided therein.

FIG. 7D shows a schematic cross-sectional view of the supporting body 100 in the tablet mode. Each of the locking plates 109 slides to the hollow of the next columnar body 101. For example, a locking plate 109[3] that has been stored in the hollow of the columnar body 101[3] in FIG. 7C slides to the hollow of the columnar body 101[4], and bridges the columnar body 101[3] and the columnar body 101[4].

The motion of the locking plates 109 may be electrically and/or mechanically controlled. For example, the locking plates 109 may be designed to move while sensing the angle between two neighboring columnar bodies 101. Alternatively, the locking plates 109 may be designed to move while sensing some pressure to the columnar bodies 101.

(Spring or Elastic Material)

Figure 8A:
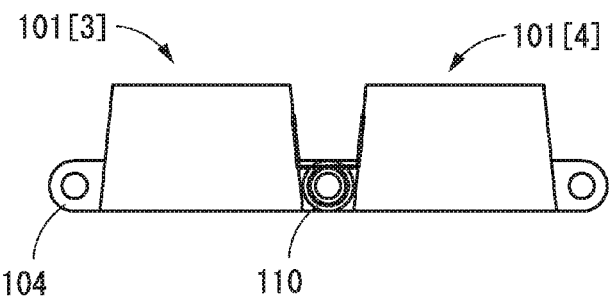
FIGS. 8A to 8C show examples for explaining an electronic device.
Figure 8B:
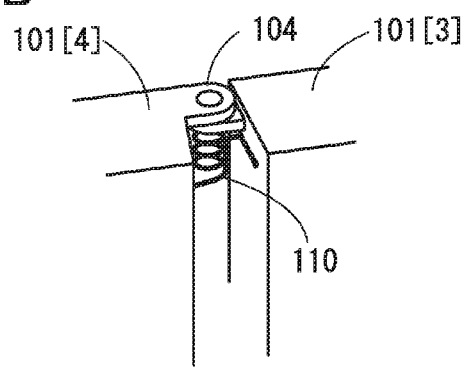
Figure 8C:
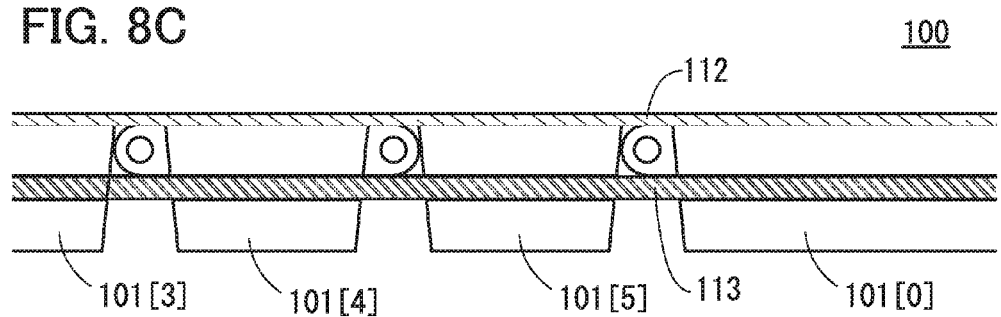

Using springs or elastic materials is also effective. FIGS. 8A to 8C show examples of implementing springs or elastic materials into the electronic device. Introducing them enhances the feel of the electronic device as it does not feel limp and gives certain resistance to the user's grip.

This function can be implemented by putting a spring between two columnar bodies 101 to push them apart (i.e. toward outside). It is important in one example that the spring is used in combination with a stop that prevents the columnar bodies 101 from rolling toward outside.

FIG. 8A is a schematic view of the columnar bodies 101[3] and 101[4] and a spring 110 between them. FIG. 8B is a perspective view. In this example, one end of the spring 110 is fixed to the columnar body 101[3] and the other end is fixed to the columnar body 101[4]. In this example, the axis of the spiral of the spring 110 is parallel to the rotation axis of the columnar bodies 101[3] and 101[4], but one embodiment of the present invention is not limited thereto.

The function of a spring can also be implemented by positioning an elastic material (such as rubber, silicone resin, and so on) in the electronic device. For example, two layers (or rods, plates, bodies or the like) of the elastic material are provided to sandwich the rotation axes of the columnar bodies 101. FIG. 8C shows an example using an elastic material layer 112 and an elastic material layer 113, in which example the electronic device is flattened when there is no force applied thereto. The elastic material layer 113 can be provided through the columnar bodies 101.

(Other Equipment)

Furthermore, (part of) the supporting body 100 may be designed to work as a physical button. For example, the physical button can be implemented by incorporating a pressure sensor into the columnar body 101 and measuring the mechanical stress that the columnar body 101 is affected by when the user holds the electronic device. The pressure sensor may be made using piezo resistors, for example. The columnar bodies 101 can be made of a more elastic (rubber-like) material that allows a more distinctive springy feel when the user holds the grip.

Further, one or more mechanical buttons may be provided between two columnar bodies 101 so that the user feels a real pressing.

The above explained techniques, such as stops, locking plates, and springs, can be combined with each other to obtain more preferable results.

(Electronic Device 1)

Figure 9A:
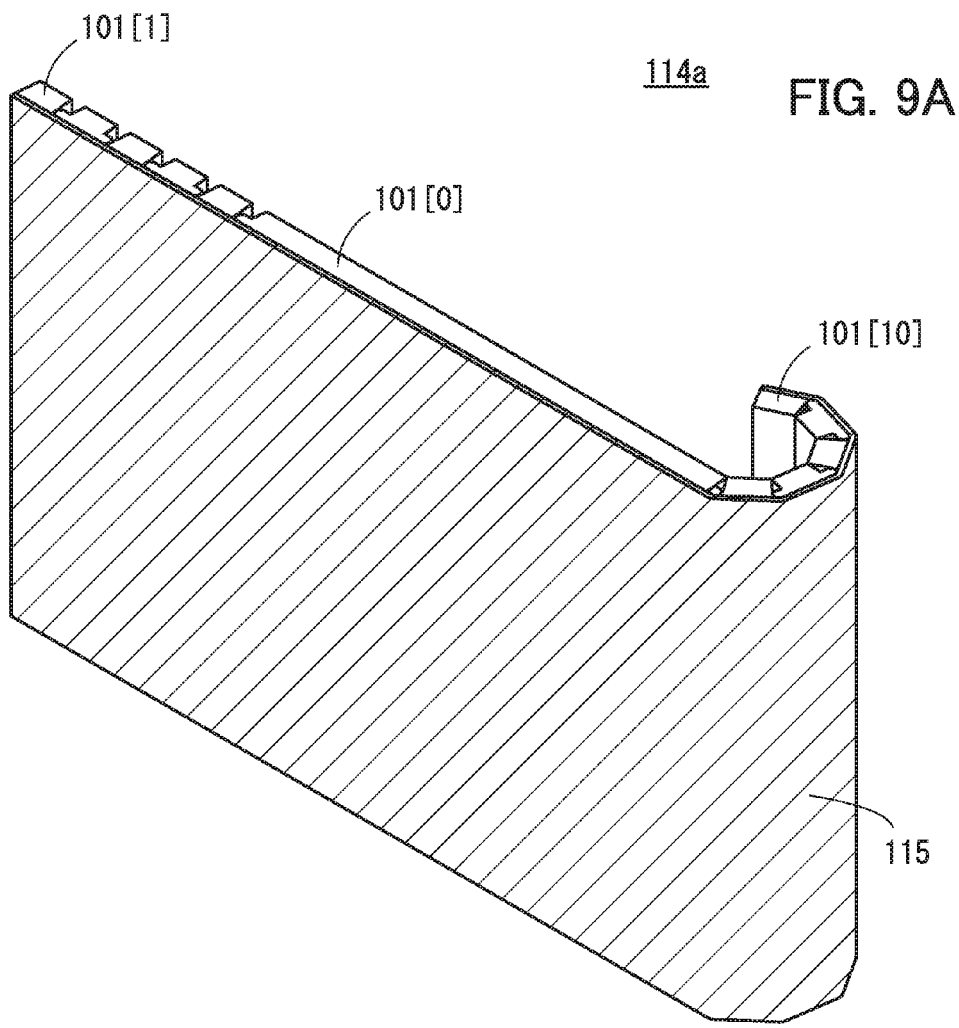
FIGS. 9A to 9C show examples for explaining an electronic device.

The electronic device is made by mounting a flexible display over the supporting body 100 described above. FIG. 9A shows an electronic device 114*a* in the eBook mode. The electronic device 114*a* includes the supporting body and a flexible display 115. As explained above, the supporting body may include the columnar bodies 101[0] to 101[10] linked together.

Figure 9B:
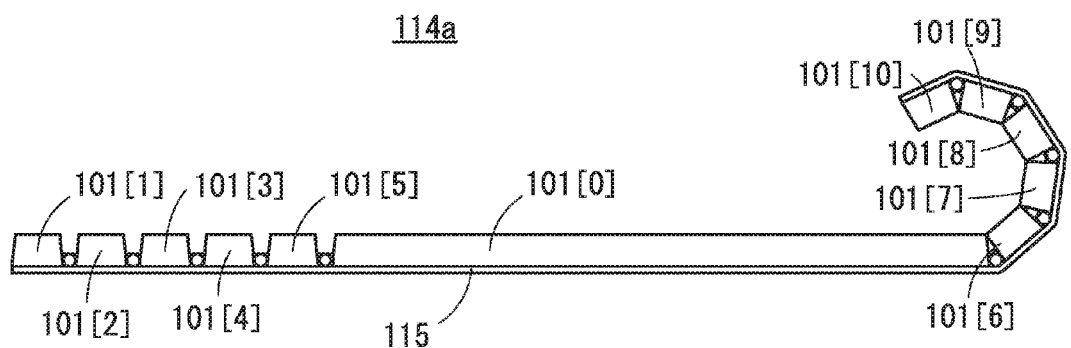
Figure 9C:
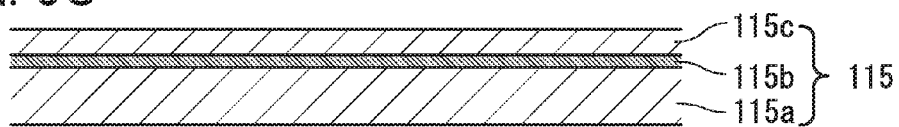

FIG. 9B shows a schematic cross-sectional view of the electronic device 114*a*. The flexible display 115 may include a flexible layer 115*a*, a device layer 115*b*, and a flexible layer 115*c*, as shown in FIG. 9C. The device layer 115*b* is located between the flexible layer 115*a* and the flexible layer 115*c* in this example. The flexible layer 115*c* that is provided between the columnar bodies 101 and the flexible layer 115*a* may be thinner than the flexible layer 115*a*. Further, a layer containing capacitive or optical touch sensors may be provided in the flexible display 115 in order to enable a multi-touch function. The function of the touch sensors may be provided in the device layer 115*b*.

As described with reference to FIG. 4C, the extended length that is proportional to the rotational radius "r" is needed for the circumference of the supporting body when the supporting body is folded. Therefore, some mechanical structure may be added for supplying the extended length.

For this purpose, the flexible display 115 may be placed without being fixed to any of the columnar bodies 101 or any of the columnar bodies 101 except the columnar body 101[0]. For example, the portions of the flexible display 115 corresponding to the columnar bodies 101[1] to 101[10] may be designed to move in accordance with the degree of folding.

(Electronic Device 2)

Figure 10A:
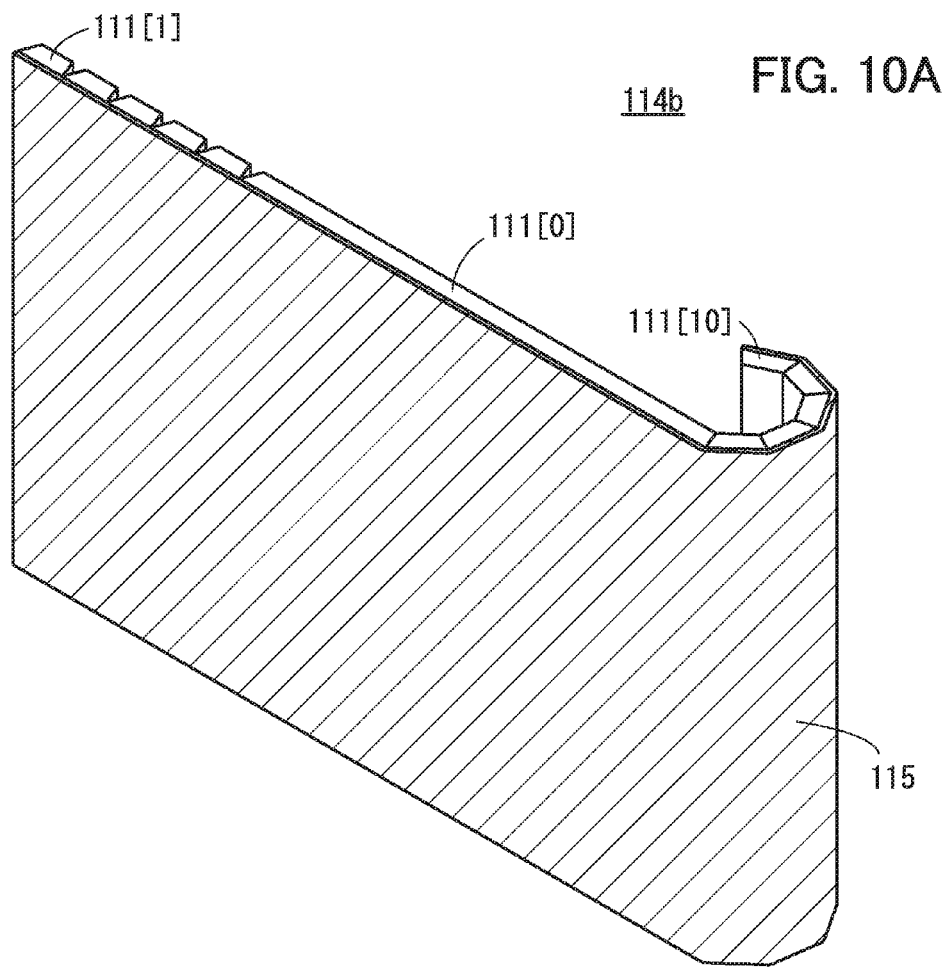
FIGS. 10A to 10C show examples for explaining an electronic device.

FIG. 10A shows another electronic device 114*b* in the eBook mode. The electronic device 114*b* includes columnar bodies 111[0] to 111[10] and the flexible display 115. In this example, the columnar bodies 111[0] to 111[10] are not directly linked together. The columnar bodies 111[0] to 111[10] are attached to the flexible display 115. Thus, the columnar bodies 111 are linked via the flexible display 115.

Figure 10B:
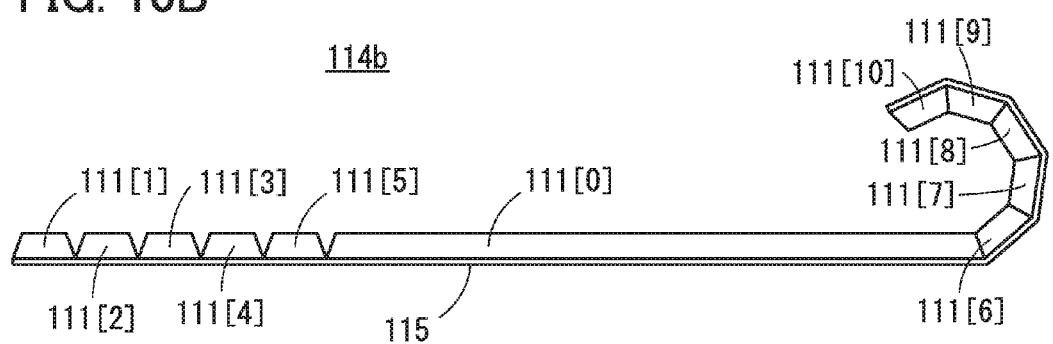
Figure 10C:
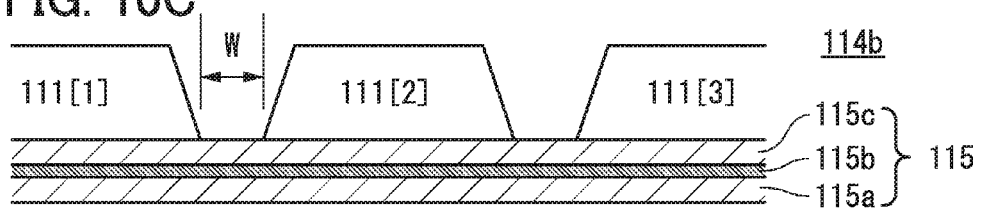

FIG. 10B shows a schematic cross-sectional view of the electronic device 114*b*. The flexible display 115 may include a flexible layer 115*a*, a device layer 115*b*, and a flexible layer 115*c*, as shown in FIG. 10C, and the columnar bodies 111 are attached to the flexible layer 115*c* at intervals of "W" that may decide the radius of curvature between the columnar bodies 111. In the electronic device 114*b*, the radius "r" may be minimized because it does not need mechanical linking. One or both of the flexible layer 115*a* and the flexible layer 115*c* may be made of some elastic material such as silicone resin or rubber.

Some techniques explained above, such as stops, locking plates, and springs, can be used in the electronic device 114*b*. For example, stops are effective for limiting the extreme folding, but not for fixing and maintaining the shape. However, with use of the stops in combination with springs or locking plates, the electronic device 114*b* can be straightened in its standard form while it can be folded (rolled) moderately.

(Tablet Mode)

Figure 11:
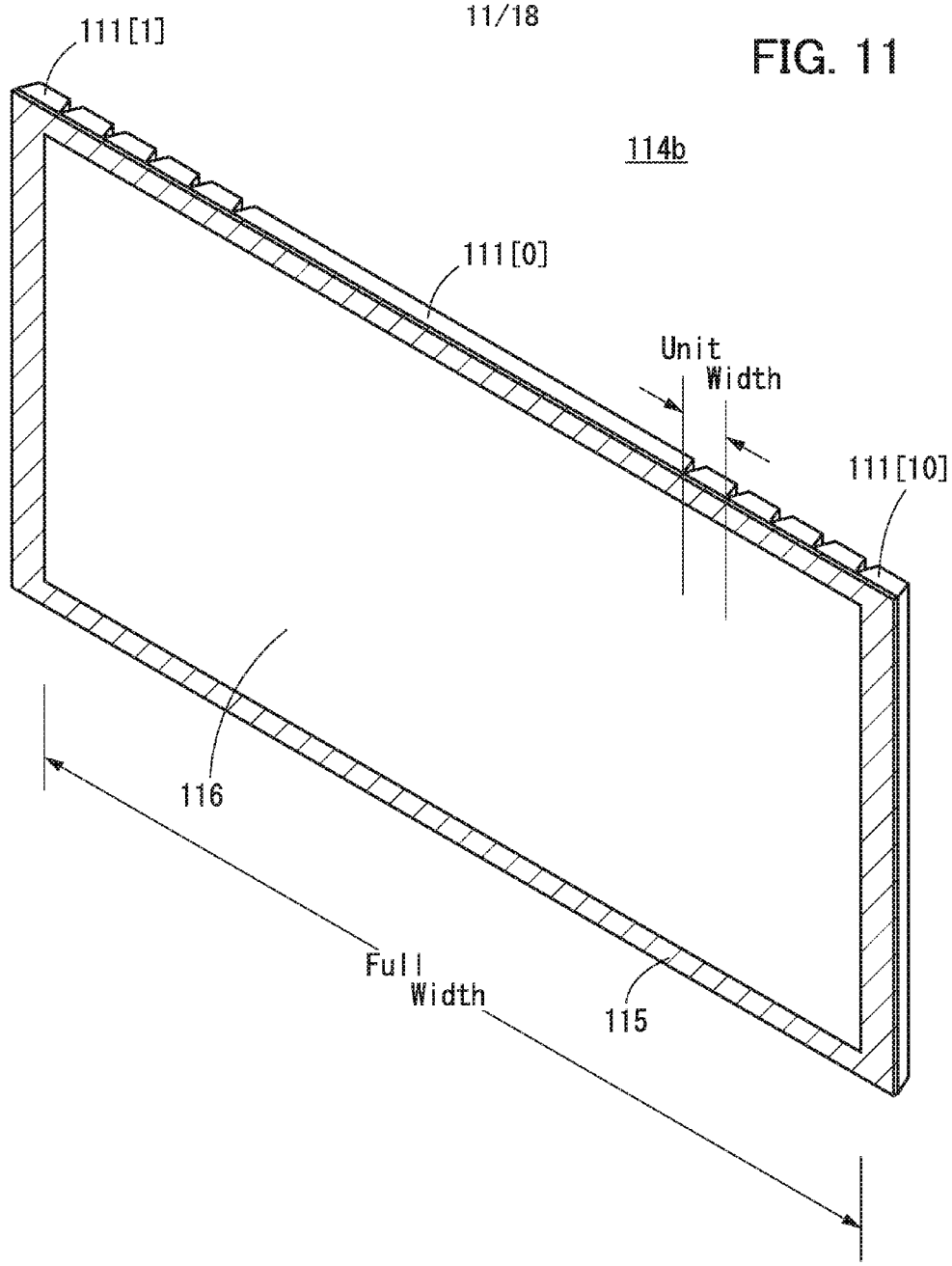
FIG. 11 shows an example for explaining an electronic device.

FIG. 11 shows the electronic device 114*b* in the tablet mode as an example. When the electronic device 114*b* is unfolded and straightened out, it is used as a regular tablet device. The locking plates can be used in order to make the electronic device 114*b* sufficiently rigid when used in the tablet mode.

Most parts of the flexible display 115 is usable as a main display area 116 in the tablet mode. Specifically, the width of the main display area 116 is called "Full Width" and the width corresponding to each columnar body 111 is called "Unit Width".

It should be noted that, for example, the portion of the flexible display 115 corresponding to the columnar body 111[5] does not always mean the portion overlapping with the columnar body 111[5].

Although the periphery of the main display area 116 contains touch sensors, they may be configured to be inactive for avoiding unnecessary reactions by the user's hand.

(eBook Mode)

Figure 12:
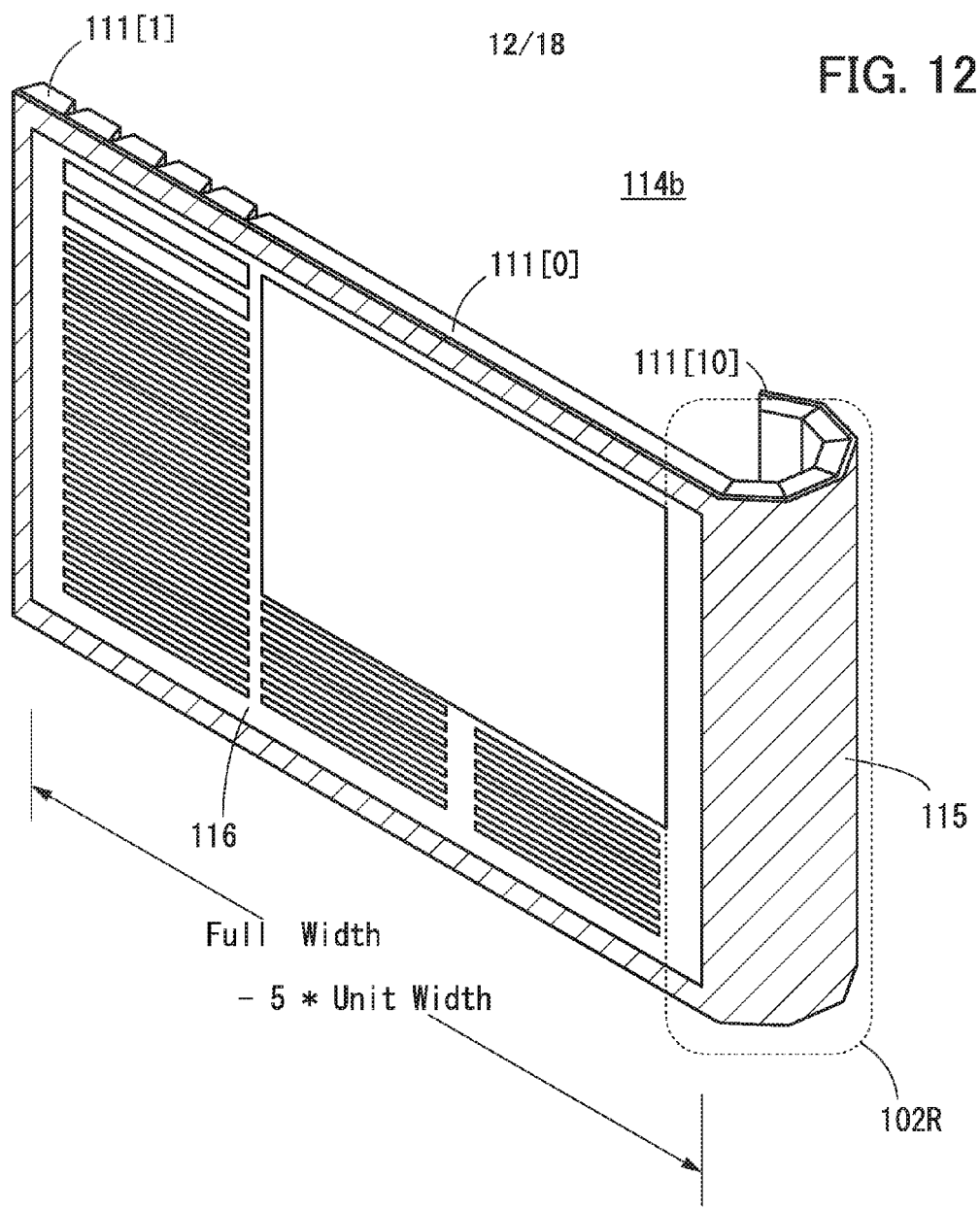
FIG. 12 shows an example for explaining an electronic device.

FIG. 12 shows the electronic device 114*b* in the eBook mode as an example. Specifically, this state is called "left eBook mode" because the columnar bodies 111[6] to 111[10] are folded and the right portion of the flexible display 115 is not used as the main display area 116. The folded columnar bodies 111[6] to 111[10] can be used as a grip 102R for holding the electronic device 114*b*.

When only one of the right and the left sides is folded, the electronic device 114*b* can enter the eBook mode. In this mode, the main display area 116 is used to show some information (text, image and/or video, for example), and the grip 102R provides a stable and comfortable hold of the electronic device while reading the information.

In the eBook mode, the left and the center portions of the flexible display 115 are used as the main display area 116. Therefore, the width of the main display area 116 is smaller than that in the tablet mode. For example, the width may be smaller than "Full Width" by five times "Unit Width". Similarly to the tablet mode, the touch sensors at the outside of the main display area 116 may be configured to be inactive.

Figure 13:
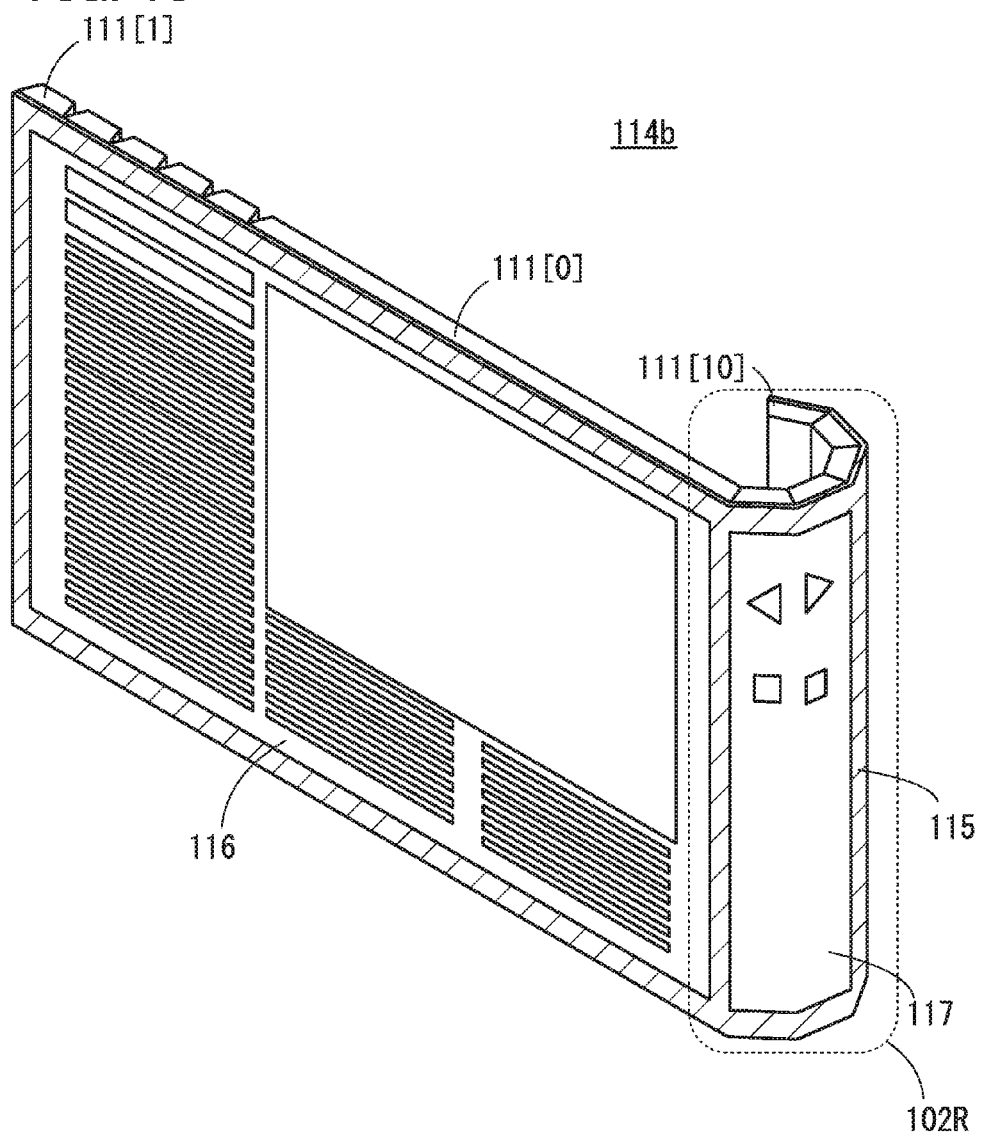
FIG. 13 shows an example for explaining an electronic device.

As shown in FIG. 13, the grip 102R can be used as a sub display area 117 displaying non-intrusive interface such as next- and previous-page buttons, an exit button, etc. In this case, the touch sensors in the sub display area 117 may be configured to be selectively active.

Furthermore, when using the physical button described above, the grip 102R can be used for navigating the document. For example, it may be configured that a single grasp executes the operation of proceeding to the next page and double grasps execute the operation of going back to the previous page.

(Game Mode)

Figure 14:
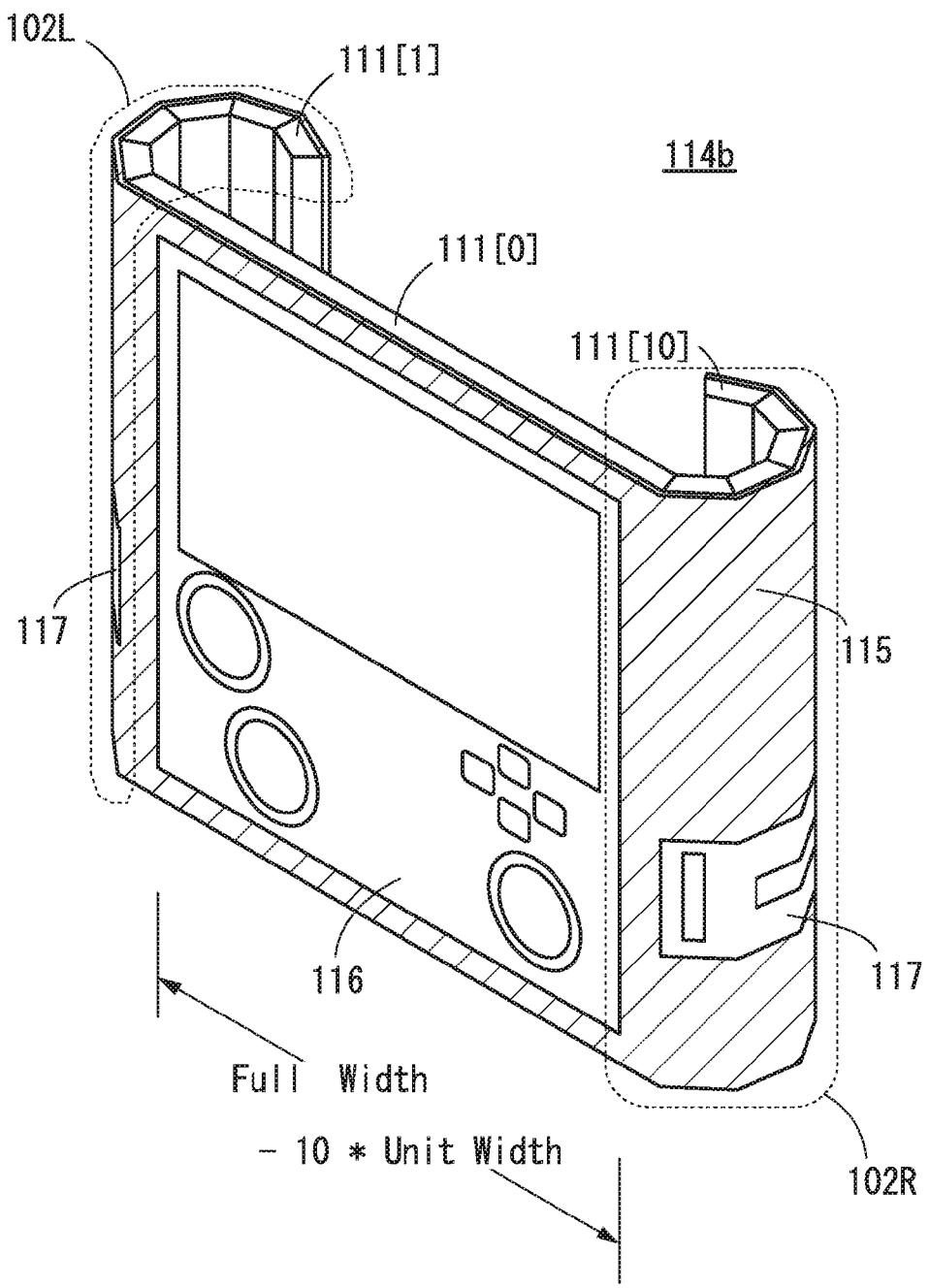
FIG. 14 shows an example for explaining an electronic device.

FIG. 14 shows the electronic device 114*b* in the game mode as an example. When both of the right and the left sides of the electronic device 114*b* are rolled, the electronic device 114*b* decides to enter the game mode. In this mode, for example, the upper half portion of the main display area 116 can be used for the video or object display window, and the bottom half portion of the main display area 116 can be used for displaying the game controls.

The columnar bodies 111[1] to 111[5] and 111[6] to 111[10] are folded and only the center portion of the flexible display 115 is used as the main display area 116. Therefore, the width of the main display area 116 is much smaller than that in the tablet mode. For example, the width may be smaller than "Full Width" by 10 times "Unit Width". The folded columnar bodies 111[1] to 111[5] and the folded columnar bodies 111[6] to 111[10] can be used as a grip 102L and a grip 102R, respectively, for holding the electronic device 114b.

Since the folded portions of the flexible display 115 include the touch sensors, they can also show additional controller buttons in the sub display areas 117 in the grips 102L and 102R, as described in the eBook mode, or with reference to FIG. 13. Note that the sub display areas 117 may be provided in both grips 102L and 102R that are the rolled portions of the electronic device 114b. As described above, physical buttons may also work at the grips 102L and 102R.

In another example, the whole or most of the main display area 116 is used for the video or object display window. This means that neither controller nor button is shown in the main display area 116. In a car-racing game, for example, the grips 102L and 102R held by the user could be used for steering, an embedded gyroscope sensor could be used to sense the rotation of the steering, and the buttons provided in the grips 102L and 102R could be used for acceleration and deceleration. No other display may be needed in the main display area 116. Larger area of the main display area 116 can be used for showing the game because of no extra input buttons displayed.

Some modifications are applicable. For example, it is possible to use the electronic device while folding only the link portions of the columnar bodies 111[2] to 111[4]. In this case, the portion of the flexible display 115 corresponding to the columnar bodies 111[0] and 111[5] to 111[10] can be used as a display, which is a modified right eBook mode.

The above examples are explained using the electronic device 114b of FIGS. 10A to 10C; however, they are applicable also to the electronic device 114a of FIGS. 9A to 9C.

(Sensor)

As described above, for the electronic device 114a (or the electronic device 114b), the main display area 116, the active touch sensors area and/or the sub display area 117 needs to be adjusted in accordance with the degree of folding (rolling). The folding can be sensed by a variety of sensors.

Figure 15A:
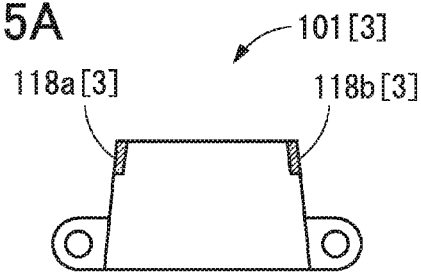
FIGS. 15A to 15C show examples for explaining an electronic device.

For example, conducting materials 118a and 118b can be integrated on the upper right and left corners of each columnar body 101, respectively, as seen in FIG. 15A.

Figure 15B:
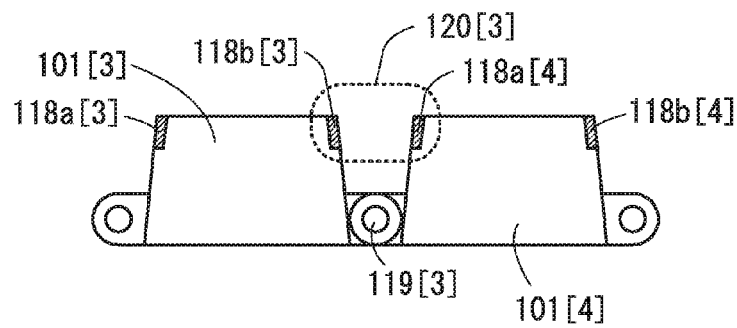

Since the columnar bodies 101 are linked, a pair of the conductive material 118a of one columnar body 101 and the conductive material 118b of the next columnar body 101 forms a resistive sensor. For example, a conductive material 118b[3] and a conductive material 118a[4] form a sensor 120[3], as seen in FIG. 15B. The sensor 120[3] corresponds to the link portion 119[3].

Figure 15C:
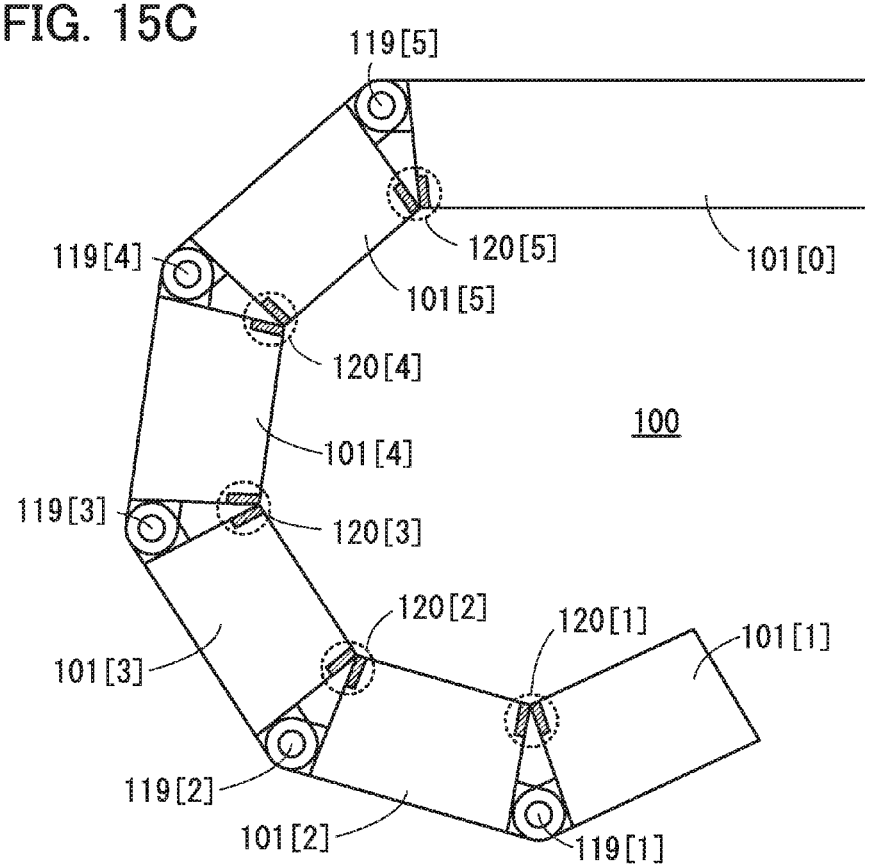

When the columnar bodies 101 are folded to touch each other at their corners, the conductive materials 118a and 118b adjacent to each other are also brought into contact to flow current. Therefore, it is decided that the corresponding link portion 119 is sufficiently folded. In FIG. 15C, it is decided that all of the link portions 119[1] to 119[5] are sufficiently folded because the corresponding sensors 120[1] to 120[5] are conductive.

Note that other types of sensors than the resistive sensor, such as pressure sensors, capacitive sensors, magnetic sensors or optical sensors, can be used for sensing the degree of folding or the angle between the neighboring columnar bodies 101.

Although not shown in FIG. 15C, a sensor 120[6] is provided between the columnar body 101[0] and the columnar body 101[6]. Similarly, sensors 120[7] to 120[10] are provided, and the sensors 120[6], 120[7], 120[8], 120[9], and 120[10] correspond to link portions 119[6], 119[7], 119[8], 119[9], and 119[10], respectively.

(Mode Decision Process)

The sensors 120 can be used to automatically decide which mode the user is to make the electronic device enter. FIG. 16 shows an example of a flow chart of deciding the mode.

First, it is tested whether both of the link portion 119[5] and the link portion 119[6] are folded or not. If Yes, the electronic device 114a enters the game mode. If No, it is tested whether the link portion 119[5] is folded or not. If Yes, the electronic device 114a enters the right eBook mode (R-eBook mode). If No, it is tested whether the link portion 119[6] is folded or not. If Yes, the electronic device 114a enters the left eBook mode (L-eBook mode). If No, the electronic device 114a enters the tablet mode. The main display area 116 is resized in accordance with the decided mode.

Figure 17:
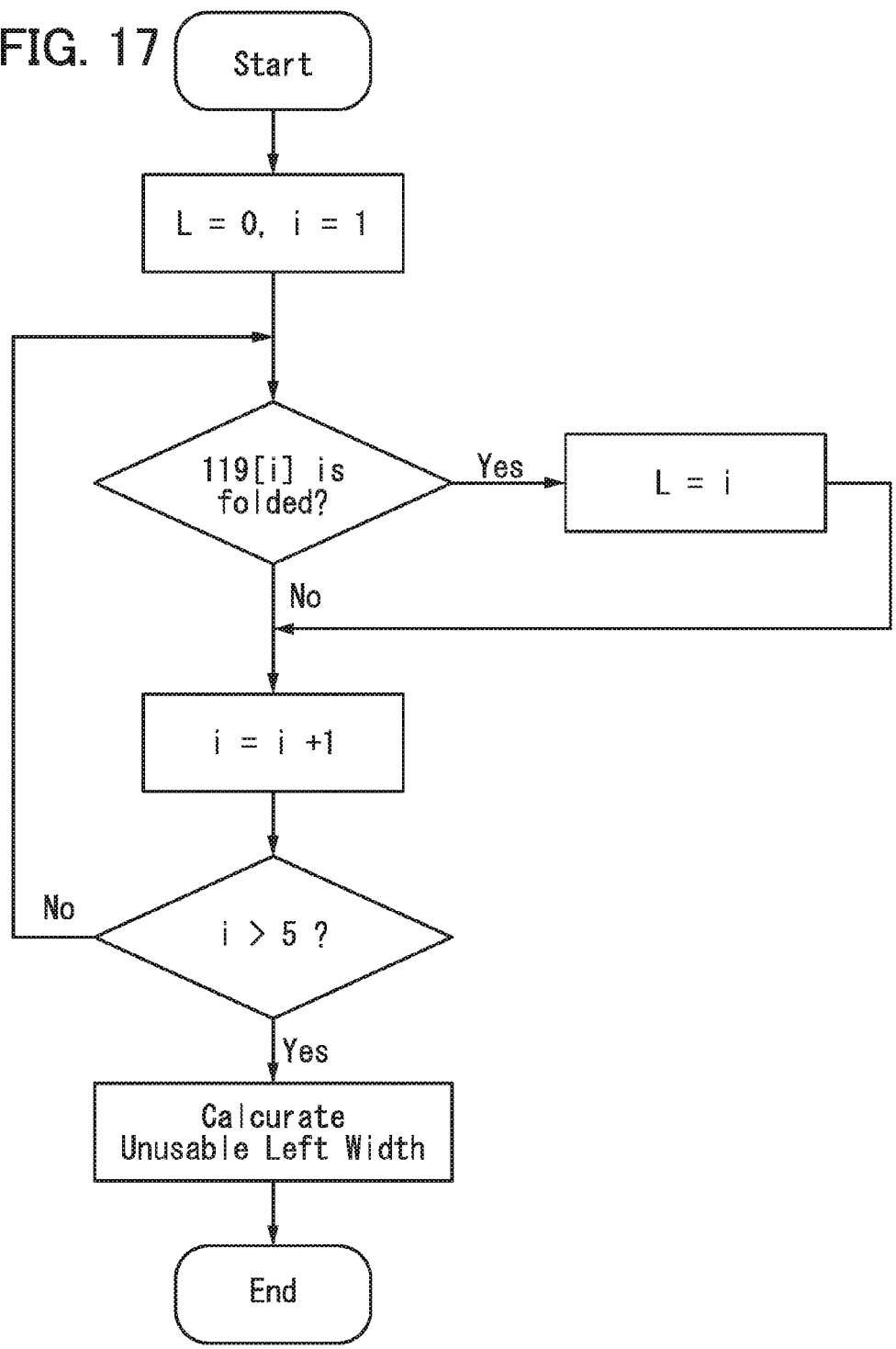
FIG. 17 shows an example for explaining a driving method of an electronic device.

FIG. 17 shows another example. The flow chart shown in FIG. 17 can be used for changing the main display area 116 in accordance with the folded portion. First, "L" is set to 0 and "i" is set to 1. Then, it is tested whether the link portion 119[i] is folded or not (first question). If Yes, "L" is set to "i" (i.e., at the first loop, "L" is set to 1). Further, regardless of the answer to the first question, "i" is increased by 1. Then, it is tested whether "i" is larger than the number of link portions at the left side of the electronic device (second question). In the electronic device 114a, the number is 5. If No, it goes back to the first question. If Yes, an unusable left width that is not usable as the main display area 116 is calculated as a product of "L" and "Unit Width".

For example, in the case where the link portions 119[1], 119[3], and 119[4] are folded, the flow chart of FIG. 17 decides that "L" is four and the unusable left width is four times "Unit Width", so that the portion corresponding to the columnar body 101[5] is usable as the main display area 116 while the portion corresponding to the columnar bodies 101[1] to 101[4] is not used even though the link portion 119[2] is not folded.

Figure 18:
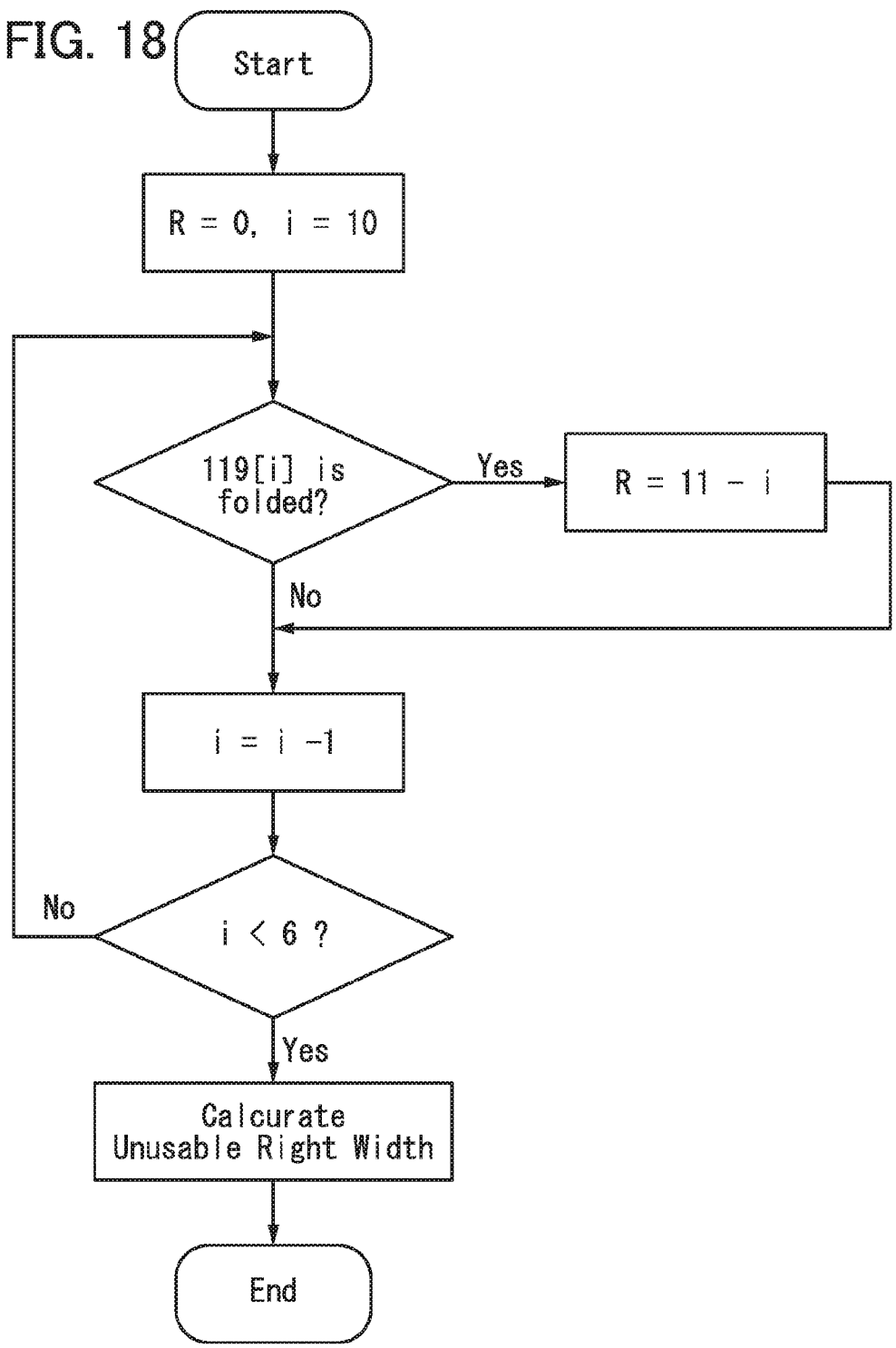
FIG. 18 shows an example for explaining a driving method of an electronic device.

The flow chart of FIG. 17 can decide only the left side of the main display area 116. The right side can be decided by the flow chart of FIG. 18. The process of FIG. 18 is similar to that of FIG. 17, and the unusable right width that is not usable as the main display area 116 is calculated similarly.

Accordingly, the width of the main display area 116 is decided by subtracting the unusable right width and the unusable left width from "Full Width".

The calculation may be varied in accordance with the decided mode. For example, "L" or "R" directly obtained from the flow charts of FIG. 17 and FIG. 18 is used for calculating the width of the main display area 116 in the eBook mode, while the unusable right width (or the unusable left width) is defined as the product of "L−1" (or "R−1") and "Unit Width" in the game mode.

REFERENCE NUMERALS

100: supporting body, 101: columnar body, 102R: grip, 102L: grip, 103a: side surface, 103b: side surface, 104a: connection portion, 104b: connection portion, 105a: hole, 105b: hole, 106: stop, 107: stop, 108: hollow, 109: locking plate, 110: spring, 111: columnar body, 112: elastic material layer, 113: elastic material layer, 114a: electronic device, 114b: electronic device, 115: flexible display, 115a: flexible layer, 115b: device layer, 115c: flexible layer, 116: main display area, 117: sub display area, 118a: conducting material, 118b: conducting material, 119: link portion, 120: sensor This application is based on Japanese Patent Application serial no. 2014-095610 filed with Japan Patent Office on May 6, 2014, the entire contents of which are hereby incorporated by reference.

What is claimed is:

1. A driving method of an electronic device, wherein the electronic device comprises a flexible display and a plurality of columnar bodies attached to the flexible display, the driving method comprising:
    detecting rotation of the plurality of columnar bodies by sensors included in the plurality of columnar bodies, and
    displaying an image at a display region of the flexible display in a first mode when the rotation of the plurality of columnar bodies is not detected and an image at a display region of the flexible display in a second mode when the rotation of the plurality of columnar bodies is detected.

2. The driving method according to claim 1, wherein a first columnar body of the plurality of columnar bodies is spaced from a second columnar body of the plurality of columnar bodies.

3. The driving method according to claim 1, wherein a size of the display region of the flexible display in the first mode is larger than a size of the display region of the flexible display in the second mode.

4. The driving method according to claim 1, wherein the sensors are resistive sensors, pressure sensors, capacitive sensors, magnetic sensors, or optical sensors.

5. The driving method according to claim 1, wherein each of the plurality of columnar bodies is mechanically or physically linked with neighboring one or two of the columnar bodies at a link portion and rotatable around an axis at the link portion.

6. The driving method according to claim 1, wherein the flexible display is a flexible organic light emission diode.

7. The driving method according to claim 1,
    wherein a first columnar body of the plurality of columnar bodies includes a first conductive material, and a second columnar body of the plurality of columnar bodies includes a second conductive material, the second columnar body neighboring the first columnar body, and
    wherein the first conductive material and the second conductive material form a resistive sensor.

8. An electronic device comprising:
    a flexible display; and
    a plurality of columnar bodies attached to the flexible display, the plurality of columnar bodies including sensors,
    wherein the sensors are configured to detect rotation of the plurality of columnar bodies, and
    wherein the flexible display is configured to display in a first mode when the rotation of the plurality of columnar bodies is not detected and to display in a second mode when the rotation of the plurality of columnar bodies is detected.

9. The electronic device according to claim 8, wherein a first columnar body of the plurality of columnar bodies is spaced from a second columnar body of the plurality of columnar bodies.

10. The electronic device according to claim 8, wherein a size of a main display region of the flexible display in the first mode is larger than a size of a main display region of the flexible display in the second mode.

11. The electronic device according to claim 8, wherein the sensors are resistive sensors, pressure sensors, capacitive sensors, magnetic sensors, or optical sensors.

12. The electronic device according to claim 8,
    wherein each of the plurality of columnar bodies is mechanically or physically linked with neighboring one or two of the columnar bodies at a link portion and rotatable around an axis at the link portion.

13. The electronic device according to claim 8, wherein the flexible display is a flexible organic light emission diode.

14. The electronic device according to claim 8,
    wherein a first columnar body of the plurality of columnar bodies includes a first conductive material, and a second columnar body of the plurality of columnar bodies includes a second conductive material, the second columnar body neighboring the first columnar body, and
    wherein the first conductive material and the second conductive material form a resistive sensor.

* * * * *